United States Patent
Li

(10) Patent No.: US 10,510,785 B2
(45) Date of Patent: Dec. 17, 2019

(54) METHOD FOR MANUFACTURING TFT SUBSTRATE AND METHOD FOR MANUFACTURING TFT DISPLAY APPARATUS

(71) Applicant: Wuhan China Star Optoelectronics Semiconductor Display Technology Co., Ltd., Wuhan, Hubei (CN)

(72) Inventor: Songshan Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 39 days.

(21) Appl. No.: 15/577,216

(22) PCT Filed: Nov. 8, 2017

(86) PCT No.: PCT/CN2017/109828
§ 371 (c)(1),
(2) Date: Nov. 27, 2017

(87) PCT Pub. No.: WO2019/041552
PCT Pub. Date: Mar. 7, 2019

(65) Prior Publication Data
US 2019/0067341 A1   Feb. 28, 2019

(30) Foreign Application Priority Data
Aug. 28, 2017  (CN) .......................... 2017 1 0749034

(51) Int. Cl.
H01L 27/12 (2006.01)
H01L 21/3213 (2006.01)
H01L 29/45 (2006.01)
H01L 21/02 (2006.01)

(52) U.S. Cl.
CPC .... H01L 27/1296 (2013.01); H01L 21/02068 (2013.01); H01L 21/32135 (2013.01); H01L 21/32138 (2013.01); H01L 21/32139 (2013.01); H01L 27/1288 (2013.01); H01L 29/458 (2013.01)

(58) Field of Classification Search
CPC ...................................................... H01L 51/56
See application file for complete search history.

(56) References Cited

U.S. PATENT DOCUMENTS

2009/0096001 A1*  4/2009  Ludwig ............ H01L 27/10852
                                                               257/303

* cited by examiner

*Primary Examiner* — Seahvosh Nikmanesh
(74) *Attorney, Agent, or Firm* — Muncy, Geissler, Olds & Lowe, P.C.

(57) ABSTRACT

The present disclosure provides a method for manufacturing a TFT substrate and a method for manufacturing a TFT display apparatus, including the steps of: providing a base substrate; forming a source/drain metal layer on the base substrate; depositing a photoresist layer on the source/drain metal layer and patterning the photoresist layer to form a desired pattern of the photoresist layer; using a $BCl_3$ gas to remove metal oxides generated on surface of the source/drain metal layer with air; and using a mixing gas including a $Cl_2$ gas and the $BCl_3$ gas to etch the source/drain metal layer.

15 Claims, 5 Drawing Sheets

METHOD FOR MANUFACTURING TFT SUBSTRATE AND METHOD FOR MANUFACTURING TFT DISPLAY APPARATUS

FIELD OF THE DISCLOSURE

The present disclosure relates to the field of display techniques, and more particularly to a method for manufacturing a thin film transistor (TFT) substrate and a method for manufacturing a TFT display apparatus.

BACKGROUND

Liquid crystal display (LCD) panels are one of the essential components of LCDs. Existing TFT LCD panels are widely used in LCD because of its outstanding properties, including low power consumption, small volume, and non-radiation.

Organic light emitting diodes (OLED) unit are organic electroluminescent display devices having outstanding properties such as simple manufacturing process, low manufacturing costs, high light-emitting efficiency, easiness of being flexible, and wide viewing angles, therefore it is a trend to use OLED unit for the display techniques.

As shown in FIG. 1, in a conventional step of etching a source/drain metal layer, a mixing gas 13 including a $Cl_2$ gas and a $BCl_3$ gas is generally used to perform etching of the source/drain metal layer 11. However, once the source/drain metal layer 11 is formed by a physical vapor deposition process, metal on surface of the source/drain metal layer 11 is prone to be oxidized to generate metal oxides 14 due to its contact with air. The metal oxides 14 remain on surface of the source/drain metal layer 11. Thus, during the next step of dry etching of the source/drain metal layer 11 by use of the mixing gas 13 including the $Cl_2$ gas and the $BCl_3$ gas, etching rate of the source/drain metal layer 11 where metal oxides 14 remain would be slow, and etching rate of the source/drain metal layer 11 where metal oxides 14 do not remain would be fast. This not only leads to poor uniformity of source electrode and drain electrode in the source/drain metal layer 11 but influences performance of TFT device.

SUMMARY OF THE DISCLOSURE

The present disclosure provides a method for manufacturing a TFT substrate and a method for manufacturing a TFT display apparatus, which ensure that all etched areas in the source/drain metal layer are etched at a same etching rate. Therefore, uniformity of the source/drain metal layer after etching step is increased, and performance of TFT device is raised.

To achieve the above mentioned objective, the present disclosure provides the following technical schemes.

In one aspect, the present disclosure provides a method for manufacturing a thin film transistor (TFT) substrate, comprising:
a step S10 of providing a base substrate;
a step S20 of forming a source/drain metal layer on the base substrate;
a step S30 of depositing a photoresist layer on the source/drain metal layer and patterning the photoresist layer to form a desired pattern of the photoresist layer;
a step S40 of using an etching gas to etch the source/drain metal layer, wherein all etched areas in the source/drain metal layer are etched at a same etching rate; and
a step S50 of stripping the photoresist layer;
wherein the step S40 of using the etching gas to etch the source/drain metal layer includes:
a step S401 of using a $BCl_3$ gas to remove metal oxides generated due to contact of the source/drain metal layer with air; and
a step S402 of using a mixing gas including a $Cl_2$ gas and the $BCl_3$ gas to etch the source/drain metal layer.

In accordance with one preferred embodiment of the present disclosure, the source/drain metal layer includes a first metal layer, a second metal layer, and a third metal layer sequentially stacked from bottom to top.

In accordance with one preferred embodiment of the present disclosure, the first metal layer and the third metal layer are a titanium metal layer, and the second metal layer is an aluminum metal layer.

In accordance with one preferred embodiment of the present disclosure, in the step S401, the metal oxides are titanium oxides generated due to corrosion of titanium.

In accordance with one preferred embodiment of the present disclosure, in the step S401, the $BCl_3$ gas has a flow rate of 1000 sccm.

In accordance with one preferred embodiment of the present disclosure, in the step S402, the $Cl_2$ gas has a flow rate of 1200-1600 sccm, and the $BCl_3$ gas has a flow rate of 150-200 sccm.

In another aspect, the present disclosure provides a method for manufacturing a thin film transistor (TFT) display apparatus, comprising: generating a TFT substrate, and generating a display device on the TFT substrate, wherein generating the TFT substrate comprises:
a step S10 of providing a base substrate;
a step S20 of forming a source/drain metal layer on the base substrate;
a step S30 of depositing a photoresist layer on the source/drain metal layer and patterning the photoresist layer to form a desired pattern of the photoresist layer;
a step S40 of using an etching gas to etch the source/drain metal layer; and
a step S50 of stripping the photoresist layer;
wherein the step S40 of using the etching gas to etch the source/drain metal layer includes:
a step S401 of using a $BCl_3$ gas to remove metal oxides generated due to contact of the source/drain metal layer with air; and
a step S402 of using a mixing gas including a $Cl_2$ gas and the $BCl_3$ gas to etch the source/drain metal layer.

In accordance with one preferred embodiment of the present disclosure, the source/drain metal layer includes a first metal layer, a second metal layer, and a third metal layer sequentially stacked from bottom to top.

In accordance with one preferred embodiment of the present disclosure, the first metal layer and the third metal layer are a titanium metal layer, and the second metal layer is an aluminum metal layer.

In a further aspect, the present disclosure provides a method for manufacturing a thin film transistor (TFT) substrate, comprising:
a step S10 of providing a base substrate;
a step S20 of forming a source/drain metal layer on the base substrate;
a step S30 of depositing a photoresist layer on the source/drain metal layer and patterning the photoresist layer to form a desired pattern of the photoresist layer;
a step S40 of using an etching gas to etch the source/drain metal layer; and
a step S50 of stripping the photoresist layer;

wherein the step S40 of using the etching gas to etch the source/drain metal layer includes:

a step S401 of using a $BCl_3$ gas to remove metal oxides generated due to contact of the source/drain metal layer with air; and a step S402 of using a mixing gas including a $Cl_2$ gas and the $BCl_3$ gas to etch the source/drain metal layer.

In accordance with one preferred embodiment of the present disclosure, the source/drain metal layer includes a first metal layer, a second metal layer, and a third metal layer sequentially stacked from bottom to top.

In accordance with one preferred embodiment of the present disclosure, the first metal layer and the third metal layer are a titanium metal layer, and the second metal layer is an aluminum metal layer.

In accordance with one preferred embodiment of the present disclosure, in the step S401, the metal oxides are titanium oxides generated due to corrosion of titanium.

In accordance with one preferred embodiment of the present disclosure, in the step S401, the $BCl_3$ gas has a flow rate of 1000 sccm.

In accordance with one preferred embodiment of the present disclosure, in the step S402, the $Cl_2$ gas has a flow rate of 1200-1600 sccm, and the $BCl_3$ gas has a flow rate of 150-200 sccm.

The present disclosure provides a method for manufacturing a TFT substrate and a method for manufacturing a TFT display apparatus. A $BCl_3$ gas with high flow rate is solely used to remove metal oxides generated on surface of the source/drain metal layer. Then, the source/drain metal layer is etched by use of a mixing gas including a $Cl_2$ gas and the $BCl_3$ gas. Such technical scheme ensures that all etched areas in the source/drain metal layer are etched at a same etching rate. Therefore, uniformity of source electrode and drain electrode in the source/drain metal layer after etching step is increased, and performance of TFT device is raised.

BRIEF DESCRIPTION OF THE DRAWINGS

To detailedly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
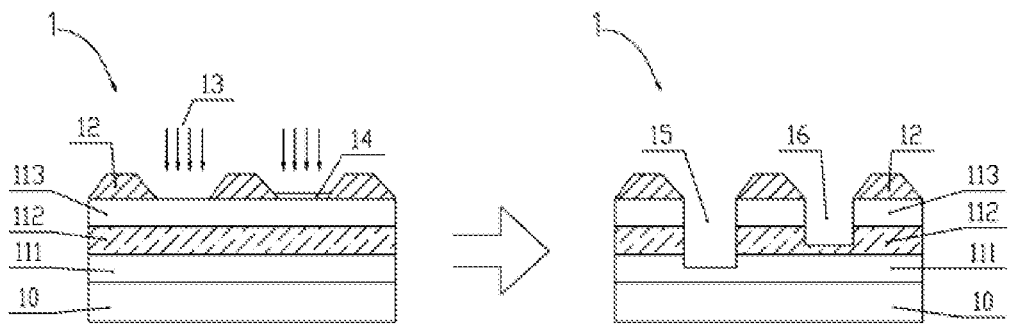
FIG. 1 shows schematic diagrams of a TFT substrate during manufacturing thereof according to the prior art.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides a method for manufacturing a TFT substrate and a method for manufacturing a TFT display apparatus, which solve problems existing in conventional processes for manufacturing a TFT substrate and a method for manufacturing a TFT display apparatus where surface of the source/drain metal layer is oxidized to generate metal oxides, making etching rate of various areas different during the next step of manufacturing process, leading to poor uniformity of TFT device, and influencing performance of TFT device.

Detailed explanation will be provided for preferred embodiments of the present disclosure in the following description with reference to the accompanying drawings.

Figure 2:
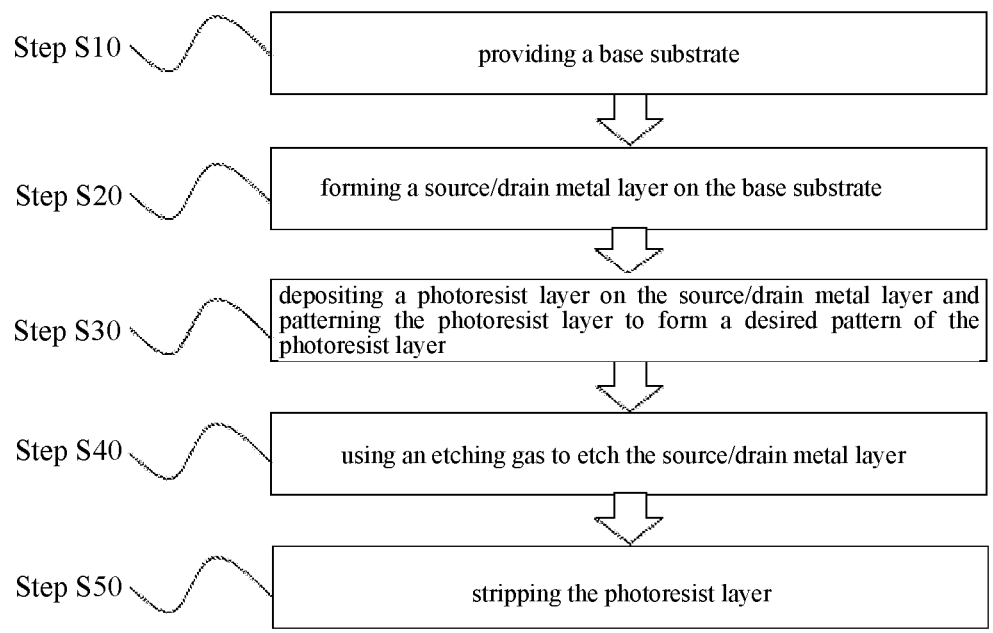
FIG. 2 is a flowchart showing a method for manufacturing a TFT substrate according to one embodiment of the present disclosure.
Figure 3:
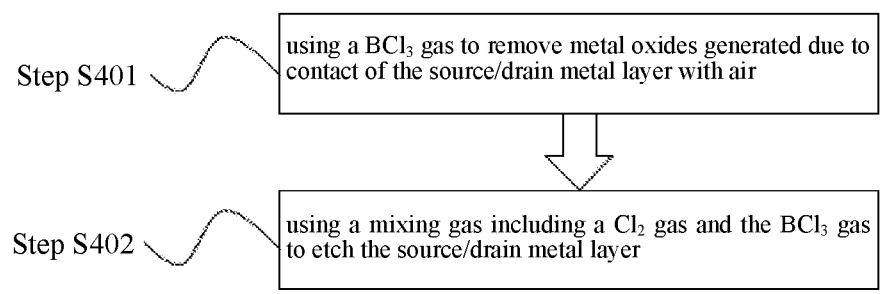
FIG. 3 is a flowchart showing a step S40 during a method for manufacturing a TFT substrate according to one embodiment of the present disclosure.

FIGS. 2 and 3 are flowcharts showing a method for manufacturing a TFT substrate according to one embodiment of the present disclosure. FIGS. 4A-4F are flow diagrams showing cross-sectional views of a TFT substrate during a manufacturing process thereof according to one embodiment of the present disclosure. The method for manufacturing the TFT substrate includes the following steps.

In a step S10, a base substrate 20 is provided.

In a step S20, a source/drain metal layer 21 is formed on the base substrate 20.

Figure 4A:
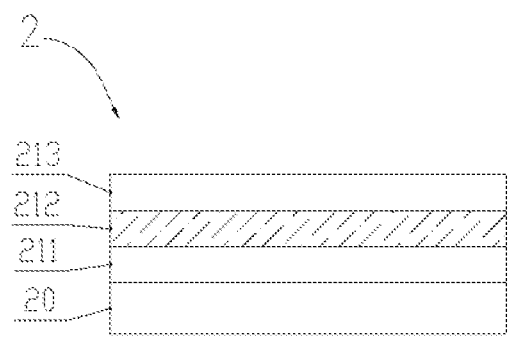
FIGS. 4A-4F are flow diagrams showing cross-sectional views of a TFT substrate during a manufacturing process thereof according to one embodiment of the present disclosure.

Specifically, as shown in FIG. 4A, a physical vapor deposition process is used to form the source/drain metal layer 21 on the base substrate 20. The source/drain metal layer 21 includes a first metal layer 211, a second metal layer 212, and a third metal layer 213 sequentially stacked from bottom to top. The first metal layer 211 is formed on surface of the base substrate 20. The third metal layer 213 is formed away from the base substrate 20.

The first metal layer 211 and the third metal layer 213 are made of titanium, and the second metal layer 212 is made of aluminum.

In a step S30, a photoresist layer 22 is deposited on the source/drain metal layer, and the photoresist layer 22 is patterned to form a desired pattern of the photoresist layer.

Figure 4B:
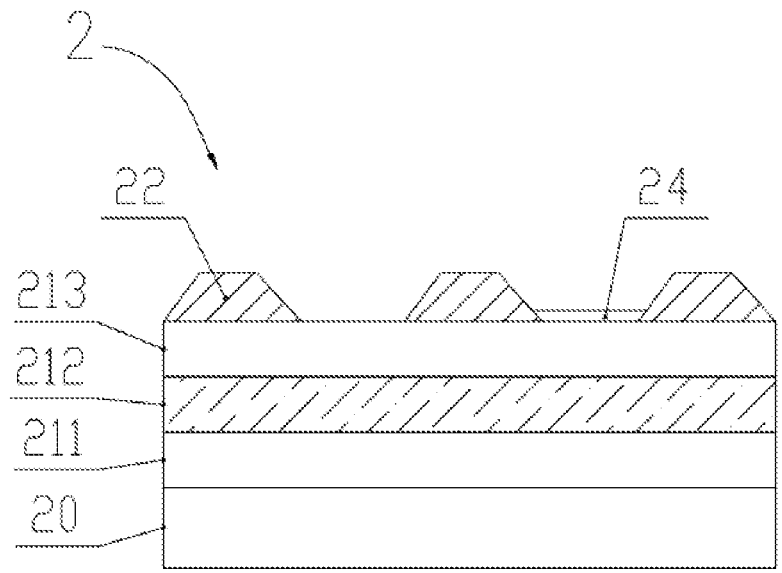

As shown in FIG. 4B, since titanium is an active metal that is prone to be corroded by oxygen in the air environment, portions of titanium on surface of the third metal layer 213 would be oxidized to generate titanium oxides 24.

In this step, a photoresist layer 22 is applied on surface of the source/drain metal layer 21 first, where the photoresist layer 22 is used to form a source electrode 25 and a drain electrode. Next, exposure of the photoresist layer 22 is executed with a mask. Then, a developing solution is utilized to remove portions of the photoresist layer 22 and thus form a desired pattern of the photoresist layer 22. To ensure uniform thickness of the photoresist layer 22, it is preferred that the photoresist layer 22 is applied by a dynamic coating process.

In a step S40, an etching gas is used to etch the source/drain metal layer.

This step is an essential step in the present disclosure. As shown in FIG. 3, the step S40 includes:

a step S401 of using a $BCl_3$ gas 231 to remove metal oxides 24 generated due to contact of the source/drain metal layer with air.

Figure 4C:
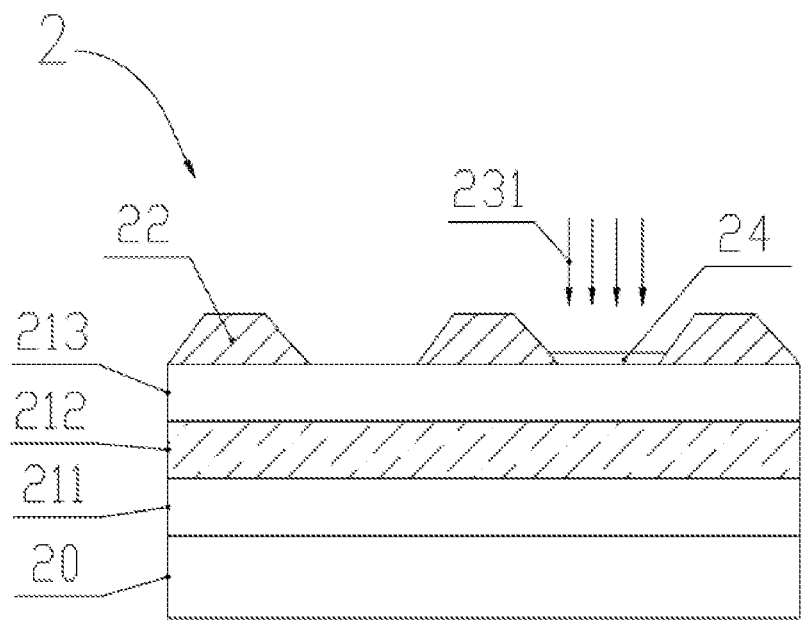

Please refer to FIG. 4C. Portions of metal on surface of the source/drain metal layer 21 are oxidized to generate metal oxides 24 that would influence following etching step. The present disclosure is characterized in using a $BCl_3$ gas with high flow rate solely to remove metal oxides 24 generated due to oxidization of portions of metal. In this step, the $BCl_3$ gas 231 has a flow rate of 1000 sccm.

In the step S401, the portions of metal on surface of the source/drain metal layer 21 that are not oxidized are shielded, for preventing the non-oxidized portions of metal from being etched by the $BCl_3$ gas 231.

The step S40 further includes:

a step S402 of etching the source/drain metal layer 21 by use of a mixing gas 232 including a $Cl_2$ gas and the $BCl_3$ gas.

Figure 4D:
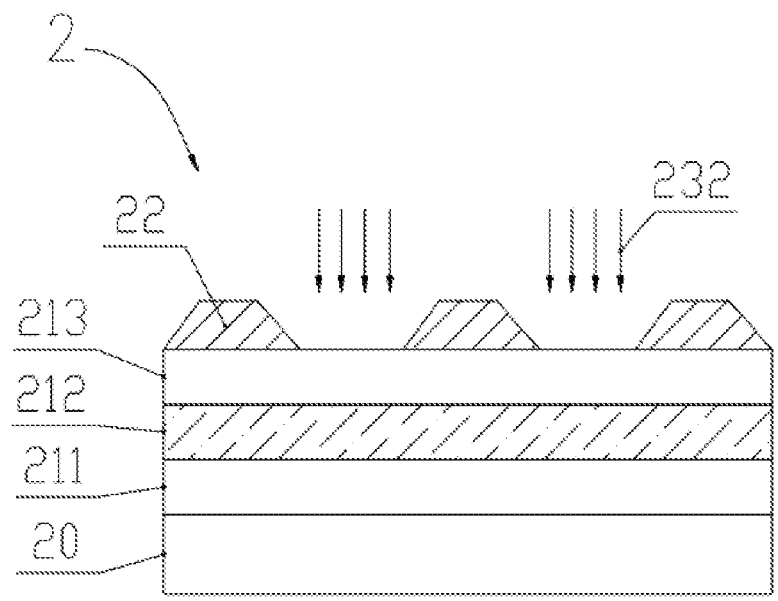
Figure 4E:
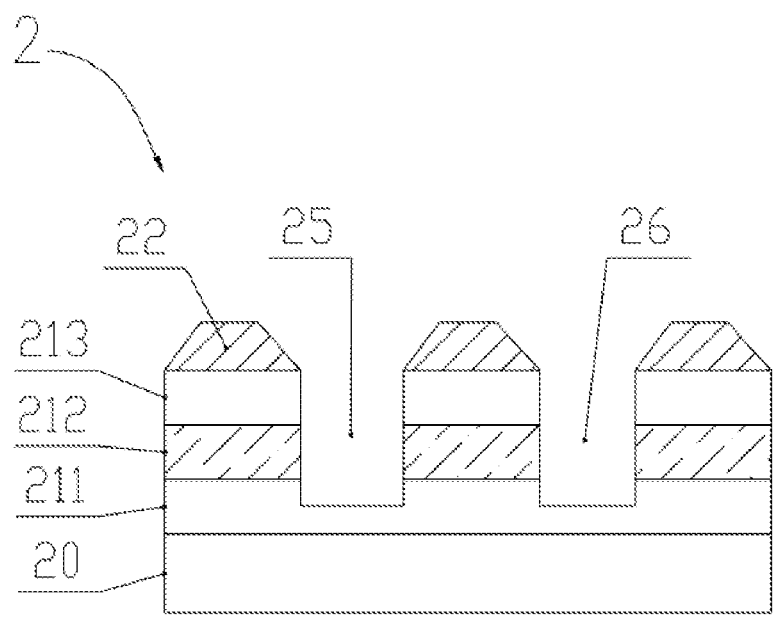

As shown in FIG. 4D, the mixing gas 232 is utilized to perform dry etching of portions of the source/drain metal layer 21. All portions that need to be etched have to be etched by an identical flow rate of the mixing gas, such that a desired source/drain metal layer 21 can be obtained.

The etched source/drain metal layer 21 includes a source electrode region 25 and a drain electrode region 26. Both the source electrode region 25 and the drain electrode region 26 are recesses obtained by etching the source/drain metal layer 21. Additionally, the source electrode region 25 and the drain electrode region 26 have the same width and the same depth.

In this embodiment, the $Cl_2$ gas has a flow rate of 1200-1600 sccm, preferably 1400 sccm. The $BCl_3$ gas has a flow rate of 150-200 sccm, preferably 175 sccm.

In a step S50, the photoresist layer 22 is stripped.

Figure 4F:
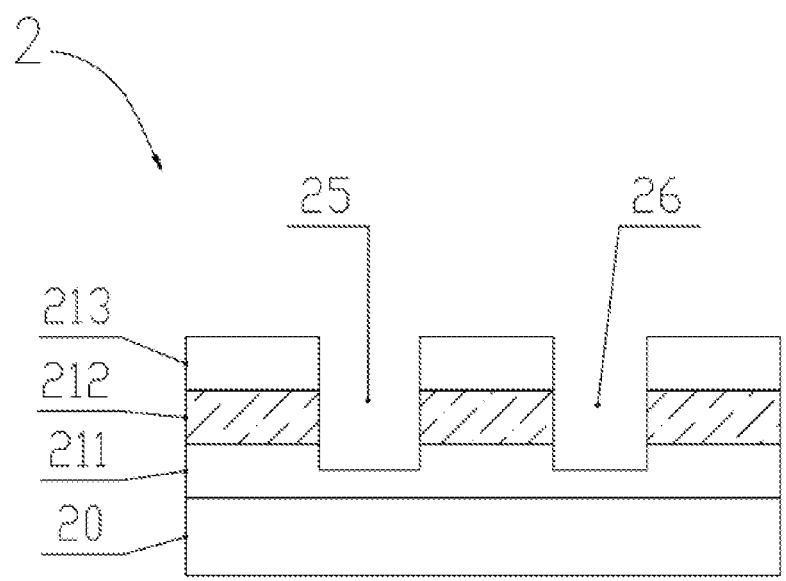

Referring to FIG. 4F, the developing solution used during the step of stripping the photoresist layer 22 is generally an alkaline stripping solution, which removes the photoresist layer 22 used to protect the non-etched portions while not removing the source/drain metal layer 21.

According to the above said objective of the present disclosure, the present disclosure further provides a method for manufacturing a TFT display apparatus, including the steps of generating a TFT substrate, and generating a display device on the TFT substrate. The display device is a display device that at least includes an anode electrode layer, an organic light-emitting layer, and a cathode electrode layer. In this case, the TFT display apparatus is an organic light emitting diode (OLED) display apparatus. Alternatively, the display device can be a color filter substrate, and thus the TFT display apparatus, in such case, is an LCD display apparatus. The step of generating the TFT substrate includes:

a step S10 of providing a base substrate;

a step S20 of forming a source/drain metal layer on the base substrate;

a step S30 of depositing a photoresist layer on the source/drain metal layer and patterning the photoresist layer to form a desired pattern of the photoresist layer;

a step S40 of using an etching gas to etch the source/drain metal layer; and a step S50 of stripping the photoresist layer;

wherein the step S40 of using the etching gas to etch the source/drain metal layer includes:

a step S401 of using a $BCl_3$ gas to remove metal oxides generated due to contact of the source/drain metal layer with air; and a step S402 of using a mixing gas including a $Cl_2$ gas and the $BCl_3$ gas to etch the source/drain metal layer.

The source/drain metal layer includes a first metal layer, a second metal layer, and a third metal layer sequentially stacked from bottom to top.

The first metal layer and the third metal layer are a titanium metal layer, and the second metal layer is an aluminum metal layer.

The method for manufacturing a TFT display apparatus in the present preferred embodiment is based on the same principle as that described above for the method for manufacturing a TFT substrate, and thus is omitted.

The present disclosure provides a method for manufacturing a TFT substrate and a method for manufacturing a TFT display apparatus. A $BCl_3$ gas with high flow rate is solely used to remove metal oxides generated on surface of the source/drain metal layer. Then, the source/drain metal layer is etched by use of a mixing gas including a $Cl_2$ gas and the $BCl_3$ gas. Such technical scheme ensures that all etched areas in the source/drain metal layer are etched at a same etching rate. Therefore, uniformity of source electrode and drain electrode in the source/drain metal layer after etching step is increased, and performance of TFT device is raised.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a thin film transistor (TFT) substrate, comprising:
    a step S10 of providing a base substrate;
    a step S20 of forming a source/drain metal layer on the base substrate;
    a step S30 of depositing a photoresist layer on the source/drain metal layer and patterning the photoresist layer to form a desired pattern of the photoresist layer;
    a step S40 of using an etching gas to etch the source/drain metal layer, wherein all etched areas in the source/drain metal layer are etched at a same etching rate; and
    a step S50 of stripping the photoresist layer;
    wherein the step S40 of using the etching gas to etch the source/drain metal layer includes:
        a step S401 of using a $BCl_3$ gas to remove metal oxides generated due to contact of the source/drain metal layer with air; and
        a step S402 of using a mixing gas including a $Cl_2$ gas and the $BCl_3$ gas to etch the source/drain metal layer.

2. The method for manufacturing a TFT substrate according to claim 1, wherein the source/drain metal layer includes a first metal layer, a second metal layer, and a third metal layer sequentially stacked from bottom to top.

3. The method for manufacturing a TFT substrate according to claim 2, wherein the first metal layer and the third metal layer are a titanium metal layer, and the second metal layer is an aluminum metal layer.

4. The method for manufacturing a TFT substrate according to claim 3, wherein in the step S401, the metal oxides are titanium oxides generated due to corrosion of titanium.

5. The method for manufacturing a TFT substrate according to claim 1, wherein in the step S401, the $BCl_3$ gas has a flow rate of 1000 sccm.

6. The method for manufacturing a TFT substrate according to claim 1, wherein in the step S402, the $Cl_2$ gas has a flow rate of 1200-1600 sccm, and the $BCl_3$ gas has a flow rate of 150-200 sccm.

7. A method for manufacturing a thin film transistor (TFT) display apparatus, comprising: generating a TFT substrate, and generating a display device on the TFT substrate, wherein generating the TFT substrate comprises:
    a step S10 of providing a base substrate;
    a step S20 of forming a source/drain metal layer on the base substrate;

a step S30 of depositing a photoresist layer on the source/drain metal layer and patterning the photoresist layer to form a desired pattern of the photoresist layer;

a step S40 of using an etching gas to etch the source/drain metal layer; and a step S50 of stripping the photoresist layer;

wherein the step S40 of using the etching gas to etch the source/drain metal layer includes:

a step S401 of using a $BCl_3$ gas to remove metal oxides generated due to contact of the source/drain metal layer with air; and a step S402 of using a mixing gas including a $Cl_2$ gas and the $BCl_3$ gas to etch the source/drain metal layer.

8. The method for manufacturing a TFT display apparatus according to claim 7, wherein the source/drain metal layer includes a first metal layer, a second metal layer, and a third metal layer sequentially stacked from bottom to top.

9. The method for manufacturing a TFT display apparatus according to claim 8, wherein the first metal layer and the third metal layer are a titanium metal layer, and the second metal layer is an aluminum metal layer.

10. A method for manufacturing a thin film transistor (TFT) substrate, comprising:

a step S10 of providing a base substrate;

a step S20 of forming a source/drain metal layer on the base substrate;

a step S30 of depositing a photoresist layer on the source/drain metal layer and patterning the photoresist layer to form a desired pattern of the photoresist layer;

a step S40 of using an etching gas to etch the source/drain metal layer; and a step S50 of stripping the photoresist layer;

wherein the step S40 of using the etching gas to etch the source/drain metal layer includes:

a step S401 of using a $BCl_3$ gas to remove metal oxides generated due to contact of the source/drain metal layer with air; and a step S402 of using a mixing gas including a $Cl_2$ gas and the $BCl_3$ gas to etch the source/drain metal layer.

11. The method for manufacturing a TFT substrate according to claim 10, wherein the source/drain metal layer includes a first metal layer, a second metal layer, and a third metal layer sequentially stacked from bottom to top.

12. The method for manufacturing a TFT substrate according to claim 11, wherein the first metal layer and the third metal layer are a titanium metal layer, and the second metal layer is an aluminum metal layer.

13. The method for manufacturing a TFT substrate according to claim 12, wherein in the step S401, the metal oxides are titanium oxides generated due to corrosion of titanium.

14. The method for manufacturing a TFT substrate according to claim 10, wherein in the step S401, the $BCl_3$ gas has a flow rate of 1000 sccm.

15. The method for manufacturing a TFT substrate according to claim 10, wherein in the step S402, the $Cl_2$ gas has a flow rate of 1200-1600 sccm, and the $BCl_3$ gas has a flow rate of 150-200 sccm.

* * * * *